United States Patent [19]
Chen et al.

[11] Patent Number: 5,447,810
[45] Date of Patent: Sep. 5, 1995

[54] MASKS FOR IMPROVED LITHOGRAPHIC PATTERNING FOR OFF-AXIS ILLUMINATION LITHOGRAPHY

[75] Inventors: Jang F. Chen, San Jose; James A. Matthews, Milpitas, both of Calif.

[73] Assignee: MicroUnity Systems Engineering, Inc., Sunnyvale, Calif.

[21] Appl. No.: 194,097

[22] Filed: Feb. 9, 1994

[51] Int. Cl.⁶ .............................................. G03F 9/00
[52] U.S. Cl. ........................................ 430/5; 430/311; 430/396
[58] Field of Search .......................... 430/5, 311, 396

[56] References Cited

U.S. PATENT DOCUMENTS

| | | | |
|---|---|---|---|
| 5,229,255 | 7/1993 | White | 430/5 |
| 5,288,569 | 2/1994 | Lin | 430/311 |
| 5,324,600 | 6/1994 | Jinbo et al. | 430/5 |

OTHER PUBLICATIONS

Shiraishi et al., "SHRINC: A New Imaging Technique for 64 Mbit DRAM," Microlithography World, pp. 7-14 (Jul./Aug. 1992).
Luehrmann, "0.35 μm Lithography Using Off-Axis Illumination," SPIE-Optical/Laser Microlithography VI Conference, San Jose, Calif. (Mar. 1993).
Tounai et al., "Resolution Improvement with Annular Illumination," SPIE Optical/Laser Microlithography V, vol. 1674, pp. 753-764 (1992).
Noguchi et al., "Subhalf Micron Lithography System with Phase-Shifting Effect," SPIE Conference, Mar. 1992.
Fehrs et al., "Illuminator Modification of an Optical Aligner," KTI Microelectronics Seminar Interface '89, KTI Chemical, Inc., San Diego, Calif., p. 217.
Matsumoto et al., "Issues and Method of Designing Lenses for Optical Lithography," Optical Engineering, vol. 31, No. 12, pp. 2657-2664 (Dec. 1992).

Primary Examiner—S. Rosasco
Attorney, Agent, or Firm—Burns, Doane, Swecker & Mathis

[57] ABSTRACT

In a lithographical tool utilizing off-axis illumination, masks to provide increased depth of focus and minimize CD differences between certain features is disclosed. A first mask for reducing proximity effects between isolated and densely packed features and increasing depth of focus (DOF) of isolated features is disclosed. The first mask comprises additional lines, referred to as scattering bars, disposed next to isolated edges. The bars are spaced a distance from isolated edges such that isolated and densely packed edge gradients substantially match so that proximity effects become negligible. The width of the bars set so that a maximum DOF range for the isolated feature is achieved. A second mask that is effective with quadrapole illumination only, is also disclosed. This mask "boosts" intensity levels and consequently DOF ranges for smaller square contacts so that they approximate intensity levels and DOF ranges of larger elongated contacts. Increasing the intensity levels in smaller contacts reduces critical dimension differences between variably sized contact patterns when transferred to a resist layer. The second mask comprises additional openings, referred to as anti-scattering bars, disposed about the square contact openings. The amount of separation between the edge of the smaller contact and the anti-scattering bars determines the amount of increased intensity. The width of the anti-scattering bars determines the amount of increase in DOF range. Both scattering bar and anti-scattering bars are designed to have a widths significantly less than the resolution of the exposure tool so that they do not produce a pattern during exposure of photoresist.

24 Claims, 3 Drawing Sheets

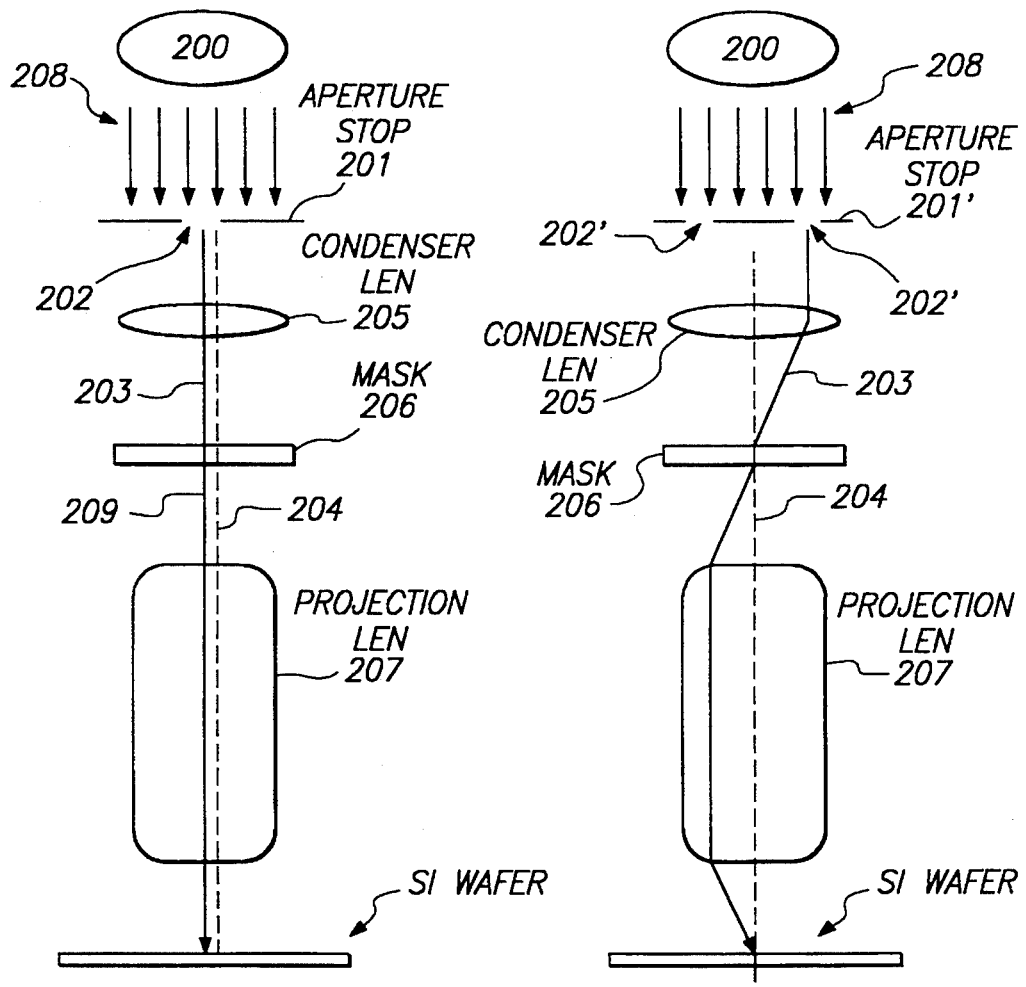
FIG. 1
ON-AXIS ILLUMINATION
FIG. 2
OFF-AXIS ILLUMINATION
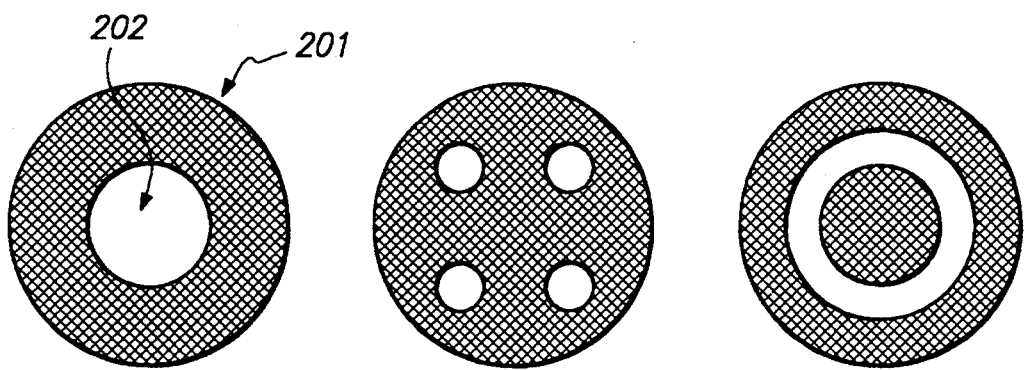
FIG. 3   FIG. 4   FIG. 5

ISOLATED FEATURE

EXTERIOR FEATURE OF
A DENSE PATTERN

DENSE FEATURE

SCATTERED
ISOLATED FEATURE

SCATTERED EXTERIOR FEATURE
OF A DENSE PATTERN

▭ THE BOX INDICATES THE AREA OF CD MEASUREMENTS
MADE AT THE RESIST PATTERN CROSS-SECTIONS.

MASKS FOR IMPROVED LITHOGRAPHIC PATTERNING FOR OFF-AXIS ILLUMINATION LITHOGRAPHY

FIELD OF THE INVENTION

The present invention relates to the field of photolithography, and specifically to off-axis illumination photolithography.

BACKGROUND OF THE INVENTION

Photolithography is a well known process for transferring geometric shapes present on a mask onto the surface of a silicon wafer. In the field of IC lithographic processing a photosensitive polymer film called photoresist is normally applied to a silicon substrate wafer and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

One important limiting characteristic of any exposure tool is its resolution limit. The resolution limit for an exposure tool is defined as the minimum feature that the exposure tool can repeatedly expose onto the wafer. Currently, the resolution limit for most advanced optical exposure tools is around 0.4 micron, i.e. close to the smallest dimension (referred to as the critical dimension or CD) for many current IC layout designs. As a result, the resolution of the exposure tool may influence the final size and density of the IC circuit.

Another important characteristic of an exposure tool is its depth of focus, (DOF). The DOF of an exposure tool is defined as the range in which the aerial image (of a near resolution sized feature) will stay in focus. In a lithographical process in which an image is transferred into a resist layer, a minimum DOF is required. This minimum DOF ensures that the image remains sufficiently in focus throughout the resist layer. Thus, the minimum DOF range is typically greater than or equal to the thickness of the resist layer.

The DOF of an exposure tool determines the "usable resolution" setting of the exposure tool. For instance, if an exposure tool is able to resolve 0.4 micron features but has a DOF range less than the range needed to clearly focus this feature through-out the resist layer, then the 0.4 micron resolution setting can not be utilized. As can be seen, if the range of DOF of an exposure tool can be extended, the "usable" resolution limit may be decreased and smaller images may be printed.

A simplified diagram of a conventional exposure tool is shown in FIG. 1. As can be seen light source 200 projects light waves 208 through opening 202 in aperture stop 201. Opening 202 is commonly referred to as the pupil of the aperture stop. Condenser lense 205 collects the light from pupil 202 and focuses it on mask 206 such that the mask is evenly illuminated. When illuminating beam 203 passes through mask 206, imaging beam 209 is generated. Imaging beam 209 is projected through lens 207 such that the image of the pattern on the mask is focused onto the silicon wafer.

As can be seen in FIG. 1, pupil 202 is situated in the center of aperture stop 201. Because of this, illuminating beam 203 is projected along the optical axis (dashed line 204) from pupil 202 to condenser lense 205 and mask 206. This type of illumination method is called "On-axis illumination"-the name implying that the illumination beam is "on" the optical axis. FIG. 3 shows a planer view of an on-axis illuminator aperture stop 201. As is seen in FIG. 3, an on-axis aperture stop characteristically has the pupil opening disposed in the center.

In a attempt to reduce device sizes, the semiconductor industry is currently investigating a new way to reduce the "usable" resolution of the exposure tool by extending its associated DOF range. Recently, it has been noted that the DOF range of an exposure tool can be extended by changing the manner in which the mask pattern is illuminated. Specifically, it has been found that by projecting the illuminating beam at an angle other than that of the optical axis, the DOF of an exposure tool may be extended. This type of illumination technique is referred to as off-axis illumination.

FIG. 2 illustrates a simplified diagram of an exposure tool that provides off-axis illumination. Light source 200 projects light waves 208 to aperture stop 201'. As can be seen, unlike aperture stop 201 (FIG. 1), aperture stop 201' has two off-centered pupil openings. The modified aperture stop causes illuminating beam 203 to be projected from condenser lense 205 to mask 206 at an angle other than optical axis 204.

FIGS. 4 and 5 show planer views of two preferred types of off-axis aperture stops. FIG. 4 shows an aperture stop that provides one type of quadrapole illumination and the aperture stop shown in FIG. 5 provides an annular type of illumination.

As the size of integrated circuit layout designs are reduced, the critical dimension of the layout design frequently approaches the resolution limit of the exposure tool. In both on-axis and off-axis illumination exposure tools, when this occurs, inconsistencies between masked and actual layout patterns developed in the photoresist become significant. These inconsistencies occur due to various affects.

One primary affect that has drawn significant attention in the field of lithography is referred to as proximity effects. Proximity effects occur when adjacent features interact with one another in such a way to produce pattern-dependent variations. For example, lines designed to have the same dimension, but which are placed in different proximity to other features in a layout (isolated vs. densely packed), will not have the same dimensions after being developed. Thus, a group of densely packed lines tends to transfer differently when compared with an isolated line. Obviously, significant problems can arise in an IC when line widths are not consistently reproduced.

Another prevalent problem that occurs when CDs approach the resolution limit of an exposure tool is seen when printing a mask having both square and rectangular contacts. This type of mask characteristically has many variably sized, openings surrounded by large opaque areas. Inconsistencies in CDs between large and small contact openings developed into the resist layer occurs because each different sized contact has a different exposure energy requirement. In other words, the optimal energy setting for a large contact is much less than the optimal energy setting for a smaller contact. However, since only one energy setting can be utilized to expose a single mask, only one contact type is optimally transferred. The other contact type will be either over or under exposed.

Numerous solutions are available to compensate for both proximity effect problems and inconsistencies in contact CDs. One solution to the proximity effect problem is described in U.S. Pat. No. 5,242,770 assigned to the assignee of the present invention. This patent describes an improved mask comprising additional unresolvable lines that adjust the edge intensity gradient of isolated edges in the mask pattern. The isolated edge gradients are adjusted to match the, edge intensity gradients for densely packed edges. As a result, isolated and densely packed features transfer similarly and proximity effects are significantly reduced.

Further, a solution to reduce CD inconsistencies in contacts is disclosed in U.S. Pat. No. 5,256,505 assigned to the assignee of the present invention. In U.S. Pat. No. 5,256,505, energy levels of large and small contacts are matched by adding lines of opposite transparency within the larger features in the mask pattern to dim their energy intensity levels. As a result, energy requirements are matched for both large and small contacts and both types of features transfer within acceptable CD range of one another.

Although U.S. Pat. No. 5,242,770 solves proximity problems in on-axis illumination exposure tools, it is not fully effective in reducing these problems when off-axis illumination is utilized. One reason for this is because off-axis illumination significantly increases the DOF range of densely packed features but provides little DOF improvement for isolated lines. As a result, in some ways off-axis illumination has made the proximity problem even tougher to manage due to this DOF difference.

Similarly, although U.S. Pat. No. 5,256,505 provides a way of printing large and small contacts in a single mask having consistent CDs, it does not exploit the increased DOF ranges offered by off-axis illumination in larger contacts.

In conclusion, although off-axis illumination has its drawbacks, it is generally agreed in the semiconductor industry that this type of illumination can effectively be applied to extend "usable" resolution by extending DOF ranges, if the proximity and DOF differences between isolated and packed features are minimized and contact transference problems are addressed. What is needed is a means to take advantage of the increased DOF offered by off-axis illumination while also providing a means to handle proximity and contact problems.

SUMMARY OF THE INVENTION

In a lithographical apparatus utilizing off-axis type illumination, a method and mask for transferring features from a mask to a semiconductor substrate is described.

Off-axis illumination increases the DOF range of packed features but not isolated features. The benefits of increased DOF may not be exploited until the DOF range of the isolated features are also increased. The improved mask of the present invention increases the DOF range of isolated features while also reducing isolated/packed feature proximity effect problems. Increasing the DOF range of the isolated features so that they approach that of the packed features, allows for reduced resolution settings of the exposure tool.

Proximity effect problems and DOF differences between packed and isolated features are reduced by disposing additional lines, referred to as scattering bars, adjacent to isolated feature edges in the mask. The scattering bars are the same transparency as the original feature and have dimensions less than the resolution of the exposure tool. Because the scattering bars are smaller than the resolution of the exposure tool, they do not transfer onto the resist layer.

Optimal proximity and DOF adjustment of the isolated feature is dependent on the width of the scattering bar and the distance that the bar is disposed from the isolated feature edge. The distance between the bar and the isolated edge causes the edge gradients of the isolated edge to match the edge gradient of densely packed edges. This significantly reduces proximity effects between isolated and densely packed features. The width of the bar directly affects the DOF range of the isolated feature. By selecting optimal bar width and bar separation from isolated feature edges, proximity effects are decreased and the DOF range of the isolated feature is adjusted to match the DOF range of the densely packed feature.

In one embodiment of the present invention in which quadrapole illumination is utilized, scattering bars are placed a distance approximately equal to .90 x (critical dimension) and the bar width is approximately equal to one third of the critical dimension.

One method of designing the scattering bars of the present invention is to first select an optimal separation distance between the scattering bar and the isolated edge. Then, optimal width of the scattering bar is selected while utilizing the selected optimum separation. In this way the scattering bar is primarily designed to reduce proximity effects and secondarily adjusted to provide maximum DOF improvements.

The present invention also addresses problems associated with masks having variously sized contacts. This is achieved by adding features, referred to as anti-scattering bars, around the smaller contact features in the mask pattern. The anti-scattering bars have a dual affect. First, they "boost" the intensity levels of the smaller contacts so that they match the intensity level of the larger contacts. By doing this the nominal exposure requirements for large and small contacts are matched. Secondly, increasing the energy intensity level of a feature, increases its DOF. Thus, the DOF range of the small contact is increased so that it matches the DOF range of the larger contact opening. As a result, the overall DOF range for all of the features in the contact mask is increased.

In one embodiment in which quadrapole illumination is utilized the width of the anti-scattering bars is approximately equal to 30%–50% x (critical dimension). The separation of the anti-scattering bars is approximately equal to (0.90) x (critical dimension).

One method of designing the anti-scattering bars of the present invention is to first select an optimal distance between the anti-scattering bar and the smaller contact and then select the optimal width of the anti-scattering bar while utilizing the selected optimum separation. In this way, the anti-scattering bar is primarily designed to match intensity levels and secondarily adjusted to provide maximum DOF improvements.

The present invention is also applicable to all forms of photolithographic processes such as optical lithography, laser based deep UV lithography, non-laser based deep UV Lithography, etc.

BRIEF DESCRIPTION OF THE DRAWINGS

FIG. 1 illustrates a simplified exposure tool having on-axis illumination.

FIG. 2 illustrates an exposure tool having off-axis illumination.

FIG. 3 shows the planer view of an aperture stop utilized to provide on-axis illumination.

FIG. 4 shows the planer view of one type of aperture stop that provides quadrapole illumination.

FIG. 5 shows the planer view of one type of aperture stop that provides annular illumination.

DETAILED DESCRIPTION

In the following description, a mask and method for transferring features while utilizing off-axis illumination is described. Numerous specific details are set forth, such as intensity level settings, exposure tool resolution setting etc., in order to provide a thorough understanding of the present invention. It will be obvious, however, to one skilled in the art that these specific details need not be employed to practice the present invention. In other instances, well-known structures have not been shown in detail in order to avoid unnecessarily obscuring the present invention.

Off-axis illumination is a method recently utilized to increase DOF of features when transferring them in a lithographic process. Two types of off-axis illumination are currently preferred; quadrapole illumination and annular illumination. However, the quadrapole illuminator is more effective than any other means of off-axis illumination—providing as much as 200% improvement in DOF. Some examples of aperture stops designed to supply these types of illumination methods are shown in FIGS. 4 and 5. As can be seen in FIGS. 4 and 5, the quadrapole-type aperture (FIG. 4) is characterized by four pupil openings each situated in different quadrants and the annular-type aperture (FIG. 5) is shown having an annular shaped opening about the center of the aperture.

Annular and quadrapole illuminators suffer from many of the same problems: proximity effects between isolated and packed features, DOF differences in isolated and densely packed features, CD and DOF differences in variously sized contacts. The present invention discloses two improved masks and masking methods. The first improved mask and method reduces DOF differences and proximity effect problems between isolated and densely packed features. The second improved mask and masking method reduces DOF differences and differences between energy requirements between large and small contacts. In this way, the benefits of off-axis illumination may be realized. These two masking methods and masks make off-axis illumination a viable lithographical technique.

PROXIMITY CORRECTION AND DOF ADJUSTMENT OF ISOLATED AND DENSELY PACKED FEATURES

Figure 6A:
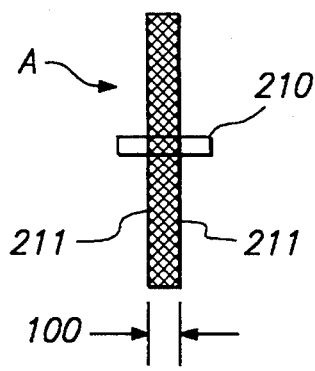
FIG. 6A–6E illustrates examples of isolated and densely packed mask pattern features with and without the scattering bars of the present invention.
Figure 6B:
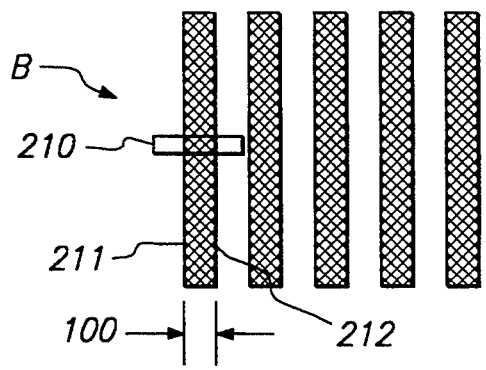
Figure 6C:
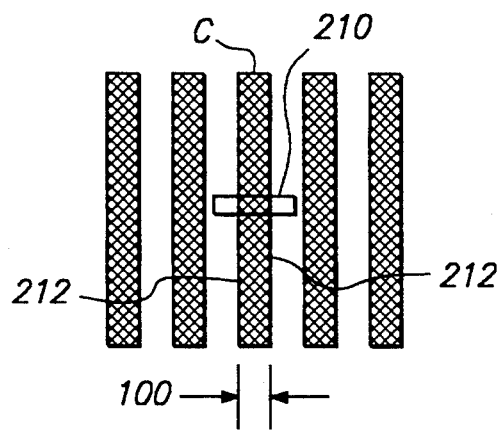

FIGS. 6A–6C show examples of features having isolated and densely packed edges. All of the features shown in FIGS. 6A–6C have widths that are equal to the CD of the circuit design. In addition, the CDs are close to the resolution limit of the exposure tool. The densely packed lines shown in FIGS. 6B and 6C are spaced approximately a distance equal to the CD of the circuit design. FIG. 6A illustrates feature A having two isolated edges 211, FIG. 6B shows feature B having an isolated edge 211 and a densely packed edge 212, and FIG. 6C shows feature C having two densely packed edges 212.

As described above, proximity effects occur because densely packed edges interact such that the original mask CDs and the final resist CDs for densely packed and isolated features are not the same. As a result, features A, B, and C transfer to a resist layer with different CD dimensions, (when CD's approach the resolution limit of the exposure tool). This is true in off-axis or on-axis illumination.

U.S. Pat. No. 5,242,770 teaches a mask that matches the intensity gradients of isolated and packed edges of features to reduce proximity effects. However, this improved mask is not effective in reducing DOF differences that occur in off-axis illumination and is not completely effective in reducing proximity effects. Thus, the improved mask disclosed in U.S. Pat. No. 5,242,770 can not be directly applied to a lithographical process utilizing off-axis illumination.

The present invention is an improved masking technique disclosed in that reduces proximity effects in off-axis illumination while extending the DOF range for isolated features. Accordingly, the present invention adjusts the width of the scattering bars of the present invention and their separation from isolated edges so that both proximity effects are reduced and the overall DOF range for the imaging tool is increased in off-axis illumination.

Figure 6D:
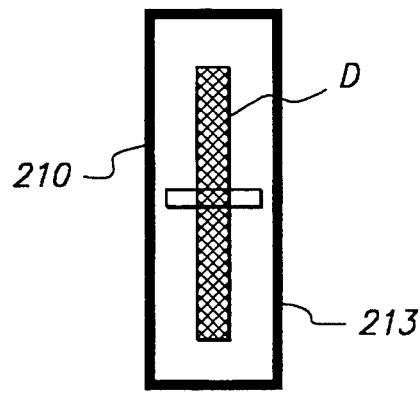
Figure 6E:
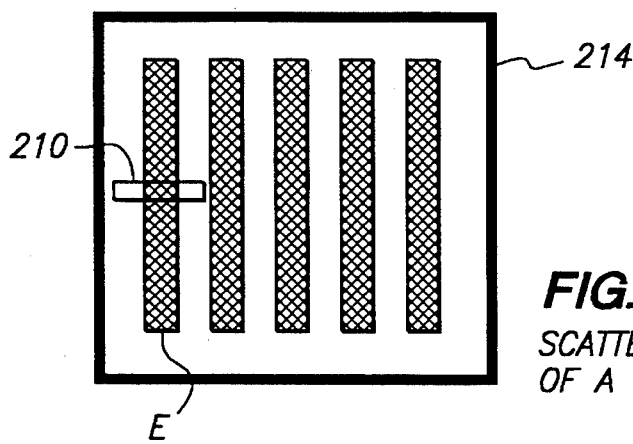

FIGS. 6D and 6E show the scattering bars of the present invention. FIG. 6D shows feature D with scattering bar 213 disposed adjacent to all isolated edges. FIG. 6E shows a set of densely packed features having scattering bar 214 disposed similarly. As illustrated, FIG. 6D corresponds to FIG. 6A and FIG. 6E corresponds to FIGS. 6C and 6B.

The scattering bars of the present invention are characterized by two parameters; their width and their separation from isolated edges of features. It has been empirically determined that the separation of the scattering bars influences proximity effects exhibited during pattern transference whereas the width of the bars affects the DOF range of the isolated features when off-axis illumination is utilized. Generally, the proximity effect issue is considered more crucial than providing increased DOF. Consequently, optimum scattering bar separation is determined first. Once the best separation is determined the width can be adjusted such that the DOF range for isolated features is increased.

Optimum separation for scattering bars is determined empirically by repeatedly exposing the pattern shown in 6D while changing the separation of the scattering bar for each exposure and keeping the width of the bar constant. The width of the scattering bar employed is 0.10 micron thick and the CD utilized for feature D is 0.4 microns. The patterns are exposed on a 1.06 micron thick OCG 895i photoresist layer by an ASM 550/60 stepper exposure tool.

By performing the procedure above at separations of 0.32, 0.36, 0.40, 0.44, and 0.48 microns for both quadrapole and annular illumination it is determined that the optimum scattering bar separation is 0.36 microns. In other words, a 0.10 micron scattering bar disposed a distance of 0.36 microns ensures that transferred CDs for isolated and packed features are substantially the same.

The affects of disposing a scattering bar 0.36 microns from all isolated edges is seen in Table 1. Table 1 gives the CD measurements of developed resist patterns for isolated feature A (FIG. 6A), densely packed feature C (FIG. 6C), and isolated feature D (FIG. 6D) having scattering bar 213 disposed 0.36 microns from feature D's isolated edges. Table 1 also shows the CD measurements of partially isolated feature B (FIG. 6B) and and partially isolated feature E (FIG. 6E) having scattering bar 214 disposed 0.36 microns from feature E's isolated edge. Ideally, the CDs of feature D and partially isolated feature E should be close to the CD for densely packed feature C.

TABLE 1

| Feature Type | A | B | C | D | E |
|---|---|---|---|---|---|
| Exposure Used (mJs) | 135 | 145 | 155 | 150 | 150 |
| CD @ Top (microns) | 0.277 | 0.270 | 0.262 | 0.259 | 0.259 |
| CD @ Bottom (microns) | 0.399 | 0.403 | 0.385 | 0.379 | 0.390 |
| % Nominal exposure difference to feature C exposure energy | 12.9% | 6.5% | 0% | 3.2% | 3.2% |

Figures 7A, 7B:
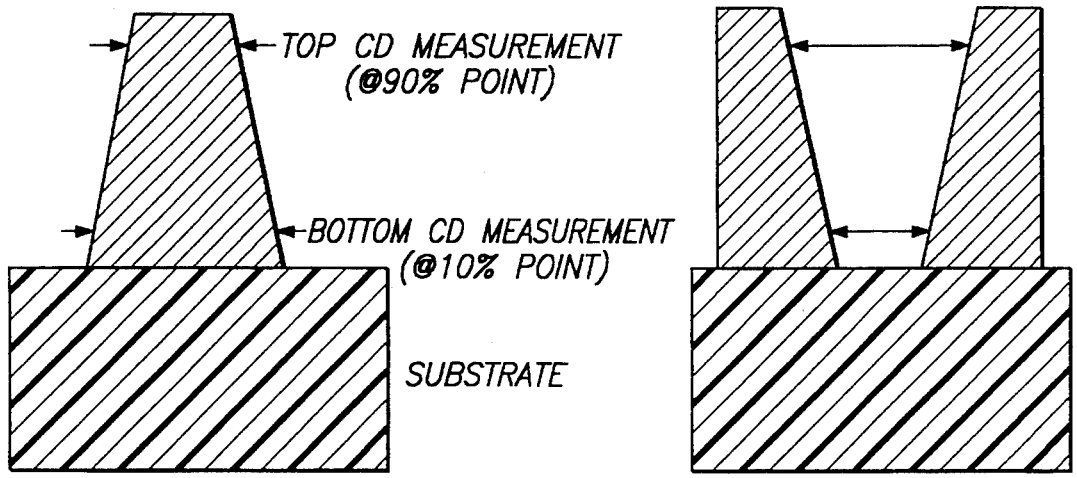
FIG. 7A and 7B shows the measurement locations of resist cross-sections.

All CD measurements are taken at location 210 shown in FIGS. 6A, 6C, and 6D. FIG. 7A illustrates an enlarged cross-section of location 210. As can be seen, one CD measurement is taken near the top of the cross-section, i.e at 90% of the cross-section total height, and the another CD measurement is taken near the bottom of the cross-section, i.e. at 10% of the total cross-section height. It should be noted that the bottom CD measurement is considered more critical than the top. The top CD measurement only serves as a reference for each resist pattern measured. Normally, a good resist pattern must be measurable at both sites—top and bottom. If the top CD reading becomes unobtainable, the resist pattern is either out of focus or inadequate exposure energy was applied.

Exposure energies in Table 1 are chosen so as to obtain as close to (i.e. within 5%) a 0.40 micron CD measurement as possible. As can be seen in Table 1, the exposure energy required to obtain a 0.385 bottom CD measurement for densely packed feature C (the reference feature) is 155 milli Joules (mJs). However, isolated feature A requires 135 mJs to achieve a bottom CD measurement of 0.399 micron. This indicates a 12.9% difference between the required energy for features A and C. Similarly, partially isolated feature B requires 145 mJs to obtain a 0.403 bottom CD measurement—resulting in a 6.5% difference in energy requirement between feature B and feature C. This means that if feature A and features C or B are in the same mask pattern exposed to a single energy level, the CDs for the features would be inconsistent.

On the other hand, the energy requirements for scattered features D and E are much closer to that of feature C. Referring to Table 1, 150 mJs is required to obtain bottom CD measurements of 0.379 and 0.390 microns for features D and E, respectively. As can be seen, the energy requirements for the features having scattering bars disposed 0.36 microns from isolated edges are only 3.2% different than the reference features energy requirement when quadrupole illumination is utilized. Consequently, if features C, D, and E are in the same mask pattern, they will transfer to the resist layer having substantially the same CD measurements for the same energy setting. Thus, CD uniformity is substantially achieved.

Accordingly, in one embodiment of the present invention the optimum separation of the scattering bar is preferably set to 90% of the CD, (where the CD is near the resolution limit of an exposure tool utilizing off-axis illumination). In other words, for an exposure tool having a 0.40 micron resolution limit, the optimum separation limit is 0.36 microns; for an exposure tool having a 0.50 micron resolution limit, the optimum separation limit is 0.45 microns. Similar empirical determinations indicate the same findings above to be true for annular-type illumination.

Once the optimum separation is determined, the width is selected. In this way, the scattering bars are primarily optimized for reducing proximity effects and secondarily optimized for obtaining increased DOF range. The width of the scattering bar strongly affects the DOF of the feature. The optimum width of the scattering bar is determined in a similar manner as the optimum separation. Specifically, the pattern shown in 6D is repeatedly exposed, while changing the width of the scattering bar for each exposure and keeping the separation of the bar constant. The selected separation of the scattering bar is set at the predetermined optimal setting determined above, i.e. 0.36 microns. The CD utilized for feature D is 0.4 microns. The patterns are exposed on a 1.06 micron thick OCG 895i photoresist layer by an ASM 550/60 stepper exposure tool.

Scattering bar widths of 0.08, 0.10, 0.15, and 0.20 microns are attempted for both quadrapole and annular illumination methods. Scattering bars any wider than 0.20 microns may become resolvable when utilizing an exposure tool having a 0.40 micron resolution limit. Thus, no scattering bar wider than 0.20 microns is attempted.

TABLE 2

| Exposure (mJ) | CD Location | isolated feature A 135 | dense feature C 155 | scattered feature D bar width (microns) | | | |
|---|---|---|---|---|---|---|---|
| | | | | 0.08 150 | 0.10 150 | 0.15 150 | 0.20 150 |
| defocus @ −2.5 um | T | | 0.209 | | | | |
| | B | | 0.370 | | | | |
| defocus @ −2.0 um | T | | 0.208 | | | | |
| | B | | 0.370 | | | | |
| defocus @ −1.5 um | T | | 0.221 | | | | 0.148 |
| | B | | 0.371 | | | | 0.390 |
| defocus @ −1.0 um | T | 0.231 | 0.240 | 0.210 | 0.213 | 0.197 | 0.207 |
| | B | 0.384 | 0.382 | 0.370 | 0.376 | 0.388 | 0.388 |
| defocus @ −0.50 um | T | 0.269 | 0.256 | 0.252 | 0.250 | 0.236 | 0.232 |
| | B | 0.409 | 0.391 | 0.386 | 0.387 | 0.390 | 0.391 |
| defocus @ 0.0 um | T | 0.277 | 0.262 | 0.267 | 0.259 | 0.244 | 0.237 |
| | B | 0.399 | 0.385 | 0.380 | 0.383 | 0.394 | 0.394 |
| defocus @ 0.50 um | T | 0.261 | 0.251 | 0.243 | 0.243 | 0.239 | 0.234 |
| | B | 0.357 | 0.373 | 0.349 | 0.359 | 0.378 | 0.392 |
| defocus @ 1.0 um | T | | 0.233 | | | 0.203 | 0.210 |
| | B | | 0.358 | | | 0.352 | 0.387 |
| defocus @ 1.50 um | T | | 0.215 | | | | |
| | B | | 0.356 | | | | |
| defocus @ 2.00 um | T | | 0.207 | | | | |
| | B | | 0.379 | | | | |

Table 2 shows the measured CDs (@ different defocus settings) for features A, C and feature D with scattering bar widths ranging from 0.08 microns to 0.20 microns. The defocus setting indicates the actual direction and distance that the focus is set away from the ideal focus. As an example, a +0.50 micron defocus setting means that the focus is 0.50 micron off the ideal center of focus. The "+" sign shows that the focus has been adjusted toward the resist layer. A "−" sign indicates that the focus has been moved in the opposite direction. By pre-setting the focus during exposure in this controlled fashion, the resultant CDs can be accessed to indicate DOF performance. This is a typical method used in the industry for evaluating DOF performance of the exposure tool.

CDs are taken at the same location as described in conjunction with FIG. 7A. The criteria for an acceptable bottom CD is ±10% of the target CD. The top CD is preferably at least larger than one-third of the target CD. CD measurements are given only for those in an acceptable range. As an example, the CD measurement for feature C at a defocus of −1.50 microns was not in an acceptable range so no CD measurement is given. The DOF range is estimated to include all the defocus settings that have rendered acceptable dimensional results. For instance, the DOF range for isolated feature A is from −1.00 to +0.50; a 1.50 micron DOF range.

However, the DOF for dense feature C ranges from −2.50 to +2.00, representing a 4.5 micron range.

A comparison of the DOF ranges for the isolated feature A and densely packed feature C illustrates how off-axis illumination increases the DOF range for densely packed features but does not provide any increased DOF for isolated features. As can be seen, the DOF range of the packed feature (4.5 microns) is more than two times the DOF range of the isolated feature (1.5 microns).

Table 2 also illustrates that varying the width of feature D's scattering bar affects its DOF range. Referring to Table 2, the 0.08 micron and 0.10 micron scattering bars render DOF ranges that are the same as the isolated feature's DOF range (feature A); i.e. 1.50 microns. However, feature D with a scattering bar width of 0.15 microns has a slightly increased DOF range; i.e. 2.00 microns. The 0.20 microns scattering bar gives the most improvement in the DOF range of feature D. It ranges from −1.50 to +1.00 microns (a DOF range of 2.50 microns); this is a 1 micron increase in DOF as compared to isolated feature A. An increase of a 1 micron DOF can significantly expand the processing window.

Accordingly, from the above determinations, in one embodiment of the present invention optimum separation of a scattering bar from a feature edge is 90% of the CD of the circuit design with a width approximately equal to 0.20 microns.

As can be seen, the placement of the scattering bar is scalable the specific circuit design depending on their associated CDs—making the scattering bar masking technique of the present invention easily implemented. For example, the scattering bar placement for a 0.40 micron CD circuit design is 0.36 microns whereas the optimum separation for a 0.50 micron circuit design is 0.45 microns.

in should be noted that a separation equal to 90% of the CD and a width equal to 0.20 microns is optimal for off-axis type illumination. In contrast, the separation and width prescribed by U.S. Pat. No. 5,242,770 selects a separation equal to 1.1 times the CD measurement with a width equal to 1/5 of the CD measurement.

Table 3 gives CD measurements at various defocus settings for 1) feature D having scattering bar spacing and width as disclosed by the present invention; (width =0.20 microns and spacing =0.36 microns) and 2) feature D having scattering bar spacing and width as prescribed by U.S. Pat. No. 5,242,770; (width =0.08 microns and spacing =0.44 microns). Quadrapole type illumination is used with the same process conditions as described above in association with Table 2.

TABLE 3

| Exposure (mJ) | CD LOC. | isolated feature A 135 | scattered feature D (width = 0.2 um) (spacing = 0.36 um) 150 | scattered feature D (width = 0.08 um) (spacing = 0.44 um) 140 |
| --- | --- | --- | --- | --- |
| defocus @ −1.50 um | T B | | 0.148 0.390 | |
| defocus @ −1.0 um | T B | 0.231 0.384 | 0.207 0.388 | 0.212 0.354 |
| defocus @ −0.50 um | T B | 0.269 0.409 | 0.232 0.391 | 0.257 0.382 |
| defocus @ 0.0 um | T B | 0.277 0.399 | 0.237 0.394 | 0.271 0.394 |
| defocus @ 0.5 um | T B | 0.261 0.357 | 0.234 0.392 | 0.257 0.382 |
| defocus @ +1.0 um | T B | | 0.210 0.387 | |

Table 3 indicates that the DOF range for feature D having a scattering bar spacing and width as recommended in U.S. Pat. No. 5,242,770 is only 1.5 microns, (−1.0 microns to 0.50 microns). This is the same DOF range for isolated feature A. Clearly, the scattering bars in U.S. Pat. No. 5,242,770 do not effect the DOF range of a feature at all in off-axis illumination.

in contrast, the DOF range for feature D having scattering bars with the present invention's spacing and width is 2.50 microns (−1.50 microns to 1.00 microns)—an increase of 1.0 microns in DOF range from both the isolated case and the case in which spacing and separation are set to the criteria disclosed in U.S. Pat. No. 5,242,770.

Thus the present invention provides a masking method for transferring isolated and packed features with off-axis illumination that 1) reduces proximity effects and 2) decreasing the "usable" resolution limit of the exposure tool by increasing the DOF range for isolated features such that it approaches the DOF range of packed features. The masking technique includes providing non-resolvable lines adjacent to isolated edges. The lines have a separation that ensures the reduction of proximity effects and have a width that increases the DOF of isolated features.

DOF and Intensity Matching of Variably Sized Contacts

Another phenomena that is attributed to off-axis illumination is the dependence of DOF on contact size in the case where contact sizes approach the resolution limit of the exposure tool.

In off-axis and on-axis illumination it is noted that the intensity level for smaller contacts is often limited due to diffraction effects. As a result, the energy intensity level measured on the resist layer of the larger contact is much greater than the the energy intensity level measured on the resist layer for the smaller contact for the same given exposure energy setting. This means that the nominal exposure energy setting for the larger contact is different than the nominal energy level setting of the smaller contact. Consequently, in a mask having both small and large contacts, one will transfer optimally and the other will not.

To overcome this problem U.S. Pat. No. 5,256,505 provides a masking technique that "damps" the intensity level of the larger contact by adding opposite transparency non-resolvable lines within the larger contact feature. As a result, the larger contact's nominal energy requirement becomes the same as the energy requirement for the smaller contact. This solution can work for both off and on-axis illumination. However, in off-axis illumination it has been determined that higher peak intensity levels yield better DOF ranges. Consequently, damping intensity levels (as is done in U.S. Pat. No. 5,256,505) restricts the potential increase in DOF benefits offered by off-axis illumination. The present invention offers a solution that increases intensity levels for the smaller contacts. In this way, optimal DOF ranges are achieved for off-axis illumination.

Figure 8:
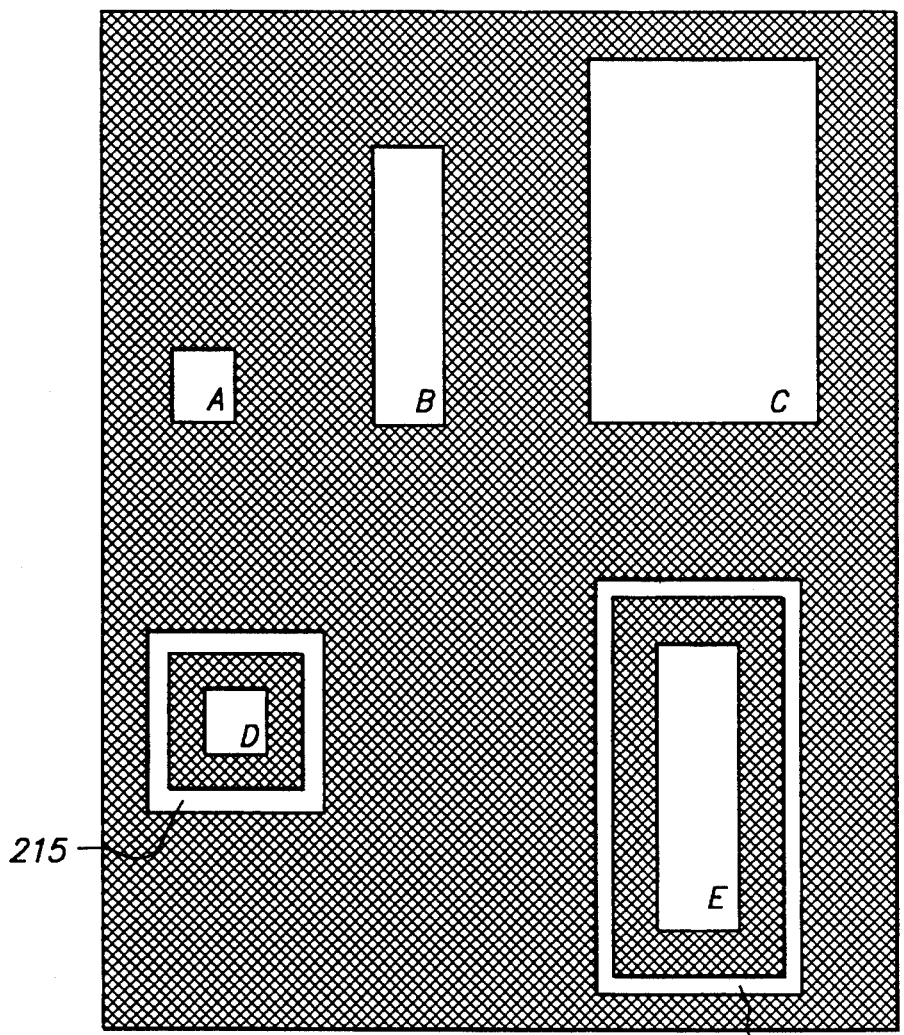
FIG. 8 shows a mask pattern having square and rectangular features with and without the anti-scattering bars of the present invention.

FIG. 8 shows three typical contacts; square contact A, elongated contact B, and enlarge contact C. The sides of contact A are all approximately the same as the circuit design CD. Similarly, the width of contact B is approximately the same as the critical dimension of the circuit. FIG. 8 also shows contacts D and E each having an anti-scattering bar of the present invention. The anti-scattering bar has the same transparency as the contact, i.e. they both allow light to go through them during exposure. The anti-scattering bar performs the function of increasing the intensity level of the smaller contact such that it matches that of the larger contact. As a result, feature D will have substantially the same energy requirements as feature B. Similarly, feature E will have substantially the same energy requirements as feature C. As with the scattering bars of the present invention, the anti-scattering bars are designed to have widths that are non-resolvable.

It should be noted that while the anti-scattering bars have the effect of increasing the intensity levels of contacts when quadrapole type of illumination is utilized, anti-scattering bars have a minimal affect on intensity levels when utilized with on-axis or annular type illumination. Thus, the present invention's anti-scattering bar improvement is most effective with quadrapole illumination.

Determination of optimal width and separation of the anti-scattering bars of the present invention are empirically determined in a similar manner as described above. The optimum separation for the anti-scattering bar of the present invention is 0.36 microns and the optimum width is 0.15–0.10 microns.

Table 4 gives CD measurements and associated nominal energy requirements for square contact A, rectangular contact B, and square contact C with anti-scattering bar 215 having a width of 0.15 microns and a separation of 0.36 microns. The exposure energy is selected so that CDs within 5% of 0.40 microns are obtainable.

TABLE 4

| Feature Type | A | B | C |
|---|---|---|---|
| Exposure Used (mJs) | 240 | 160 | 170 |
| CD @ Top (microns) | 0.537 | 0.521 | 0.507 |
| CD @ Bottom (microns) | 0.386 | 0.402 | 0.382 |
| % Nominal exposure difference to feature B exposure energy | 50% | 0% | 6.2% |

Top and bottom CD measurements are taken as shown in FIG. 7B. It should be noted that contact mask patterns form "trench" or "hole" cross-sections as shown in FIG. 7B in the resist layer. As a result, the bottom CD becomes more critical than the top one because the bottom CD determines the size of the contact opening. Top CDs are utilized to indicate the quality of contact cross-sections. As illustrated in FIG. 7B, the top CD is taken at 90% of the total cross-section height and the bottom CD is taken at 10% of the total cross-section height.

Table 4 shows that the energy requirement for square contact (feature A) is 240 mJs to obtain and top CD of 0.537 and a bottom CD of 0.386 mJs. In comparison, rectangular contact (feature B) requires 160 mJs to achieve a top CD equal to 0.521 microns and a bottom CD of 0.402 microns—representing a 50% difference in energy requirements between the non-scattered square (feature A) and rectangular contact (feature B). However, the energy requirement for square contact D with anti-scattering bar 215, is 170 mJs to obtain top CD measurements of 0.507 microns and bottom CD measurements of 0.382 microns. This represents only a 6.2% difference in energy between the rectangular contact and a square contact having an anti-scattering bar. This indicates that similar CDs are obtainable in a mask containing both of features D and B.

In a photolithography process that utilizes any illumination technique, increasing the intensity of a contact also increases its DOF. This is illustrated in Table 5. Table 5 compares the DOF range for non-scattered square contact A, rectangular contact B, and square contact D with an anti-scattering bar having a 0.36 micron separation and a 0.15 micron width. Exposure energies are chosen so that CD measurements are within 5% of 0.40 microns.

TABLE 5

| Exposure (mJ) | CD Location | square contact A 240 | elongated contact B 160 | square contact with ASB D 170 |
|---|---|---|---|---|
| defocus @ −1.0 um | T | | 0.538 | |
| | B | | 0.327 | |
| defocus @ −0.80 um | T | | 0.534 | 0.483 |
| | B | | 0.385 | 0.362 |
| defocus @ −0.30 um | T | 0.524 | 0.525 | 0.499 |
| | B | 0.415 | 0.409 | 0.363 |
| defocus @ 0.0 um | T | 0.537 | 0.521 | 0.507 |
| | B | 0.386 | 0.402 | 0.382 |
| defocus @ +0.30 um | T | | 0.525 | 0.504 |
| | B | | 0.352 | 0.325 |

Table 5 indicates that the DOF range for square contact A is 0.30 microns (0.0 microns to −0.30 microns). Therefore, contact A requires a much heavier exposure energy (240 mJs) to compensate for such a short DOF range. If contact A is developed with the same exposure energy as contact B, 160 mJ, contact A will not fully develop. In contrast, the DOF range of rectangular contact B is 1.30 microns (0.30 microns to −1.00 microns)—significantly larger than that of the square contact. The DOF range of square contact D with anti-scattering bar 215 (at approximately the same exposure energy as contact B) is 1.10 microns (0.30 microns to −0.80 microns)—slightly less than the rectangular contact. As can be seen, the square contact with the scattering bar develops significantly more like the rectangular contact than the square contact without the scattering bar.

Accordingly, in one embodiment of the present invention, anti-scattering bars are spaced a distance equal to 90% of the circuit design CD from contact openings. The width of the scattering bar is equal to 30%–50% of the CD. For example for a circuit design having a CD equal to 0.40 microns, the width of the scattering bar is approximately equal to 0.15 microns, and the spacing is equal to 0.36 microns.

It should be noted that adding anti-scattering bars to masks while utilizing on-axis or annular illumination does not yield the same results. Specifically, the anti-scattering bars of the present invention significantly increase intensity levels only when utilized with quadrapole illumination.

It should be further noted that, similar to the scattering bars of the present invention, anti-scattering bars are scalable to a specific design rule CD. This means, computer aided design (CAD) circuit layout generation may be easily modified to include an algorithm adding scattering and anti-scattering bars to the layout design.

Although the present invention has been described in conjunction with certain embodiments, it is appreciated that the invention may be implemented in a variety of other ways. By way of example, the concept of the present invention is not strictly limited to semiconductor processes; it can be applied to any photolithographic processes. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

Thus, the present invention offers a simple solution for increasing DOF ranges for exposure tools utilizing off-axis illumination.

I claim:

1. In an apparatus utilized for optically transferring a lithographic pattern corresponding to an integrated circuit from a mask onto a semiconductor substrate, said pattern including a first type of feature having at least one edge that is relatively isolated from other edges in said pattern and a second type of feature having all edges in relative close proximity to said other edges in said pattern, said apparatus utilizing off-axis illumination, wherein said off-axis illumination causes the depth of focus range of said second type of feature to be greater than the depth of focus range of said first type of feature, an improved mask comprising;
a plurality of additional lines, wherein each of said additional lines corresponds to, and is disposed on said mask at a predetermined distance from said isolated edges wherein said width of said additional lines is selected such that said depth of focus range of said first type of feature is increased so that it approaches said depth of focus range of said second type of feature.

2. The improvement of claim 1 wherein said plurality of additional lines have a width sufficiently narrow so as not to be transferred onto said substrate.

3. The improvement of claim 2 wherein said first and second types of features have a certain minimum dimension and said width of said additional lines is approximately 30%–50% of said certain minimum dimension.

4. The improvement of claim 3 wherein said predetermined distance is approximately 90% of said certain minimum dimension.

5. The improvement of claim 4 wherein said off-axis illumination is a quadrapole-type of illumination.

6. The improvement of claim 4 wherein said off-axis illumination is an annular type of illumination.

7. In a lithographical apparatus utilizing on-axis type illumination to transfer a pattern corresponding to an integrated circuit from a mask onto a semiconductor substrate, wherein said mask includes additional lines adjacent to isolated edges of isolated features to reduce proximity effects between said isolated features and densely packed features on said mask, a method for optimizing said mask for a lithographical apparatus utilizing off-axis type illumination such that DOF differentials and said proximity effects between said isolated and said densely packed features are reduced, said method comprising the steps of;
placing said additional lines a distance from said isolated edges such that said edge gradients of said isolated edges are substantially matched to the edge gradients of said densely packed feature;
then adjusting the width of said additional lines such that said width causes the DOF range of said isolated feature to approach the DOF range of said densely packed feature.

8. The improvement of claim 7 wherein said width is sufficiently narrow so as not to be transferred onto said substrate.

9. The improvement of claim 8 wherein said isolated and said densely packed features have a certain minimum dimension and said width of said additional lines is approximately 30%–50% of said certain minimum dimension.

10. The improvement of claim 9 wherein said predetermined distance is approximately 90% of said certain minimum dimension.

11. The improvement of claim 10 wherein said off-axis illumination is a quadrapole type of illumination.

12. The improvement of claim 10 wherein said off-axis illumination is an annular type of illumination.

13. In an apparatus utilized for optically transferring a lithographic pattern corresponding to an integrated circuit from a mask onto a semiconductor substrate, said apparatus utilizing quadrapole type illumination, said pattern including a first feature type and a second feature type, wherein said first and said second feature types each have an associated DOF range, and wherein said DOF range of said first feature type is greater than said DOF range of said second feature type, an improved mask comprising;
an additional feature disposed adjacent to and surrounding said second feature on said mask at a predetermined distance from all edges of said second feature, said additional feature having the same transparency as said second feature and the dimensions of said additional feature being selected such that said DOF of said second feature is increased such that it approaches said DOF of said first feature.

14. The improvement of claim 13 wherein said additional feature has a width sufficiently narrow so as not to be transferred onto said substrate.

15. The improvement of claim 14 wherein said width is approximately equal to one-third of the on-axis illumination resolution limit of said apparatus.

16. The improvement of claim 15 wherein said first and second feature types have a certain minimum dimension and said predetermined distance is approximately equal to 90% of said minimum dimension.

17. The improvement of claim 16 wherein said first feature type is relatively larger than said second feature type.

18. The improvement of claim 17 wherein said first feature type is an elongated contact feature, and said second feature type is a square contact feature.

19. In an apparatus utilized for optically transferring a lithographic pattern corresponding to an integrated circuit from a mask onto a semiconductor substrate, said apparatus utilizing quadrapole type illumination, said pattern including a first feature type and a second feature type, wherein said first and said second feature types each have an associate intensity level and DOF, and wherein said intensity level and DOF of said first feature type is greater than said intensity level and DOF of said second feature type, a method for increasing intensity and DOF range for said second feature type:
   providing an additional feature on said mask, said feature being disposed adjacent to and surrounding said second feature type and having the same transparency as said first and second feature types;
   disposing said feature a distance from said second feature type such that said distance causes said intensity level of said second feature type to be substantially matched to said intensity level of said first feature type;
   then adjusting the width of said additional feature such that said width causes the DOF range of said second feature to approach the DOF range of said first feature.

20. The improvement of claim 19 wherein said additional feature has a width sufficiently narrow so as not to be transferred onto said substrate.

21. The improvement of claim 20 wherein said width is approximately equal to one-third of the on-axis illumination resolution limit of said apparatus.

22. The improvement of claim 21 wherein said first and second feature types have a certain minimum dimension and said predetermined distance is approximately equal to 90% of said minimum dimension.

23. The improvement of claim 22 wherein said first feature type is larger than said second feature type.

24. The improvement of claim 23 wherein said first feature type is an elongated contact feature, and said second feature type is a square contact feature.

* * * * *